United States Patent
Gates et al.

[11] Patent Number: 5,950,712
[45] Date of Patent: *Sep. 14, 1999

[54] METHOD AND APPARATUS FOR COOLING AND WARMING POLE-MOUNTED ELECTRONICS

[75] Inventors: Frank Vernon Gates, Township of Roxbury, Morris County, N.J.; John McAndrewsmith, Madison, Wis.; Paul Wendell, Rockaway, Morris County, N.J.

[73] Assignee: AT&T Corp., Middletown, N.J.

[*] Notice: This patent issued on a continued prosecution application filed under 37 CFR 1.53(d), and is subject to the twenty year patent term provisions of 35 U.S.C. 154(a)(2).

[21] Appl. No.: 09/057,864

[22] Filed: Apr. 9, 1998

[51] Int. Cl.$^6$ ..................................................... F28D 15/00
[52] U.S. Cl. ..................... 165/45; 165/80.3; 165/104.34; 165/155; 62/259.2; 62/260
[58] Field of Search ........................ 165/45, 155, 104.34, 165/80.3; 62/260, 259.2

[56] References Cited

U.S. PATENT DOCUMENTS

| | | | |
|---|---|---|---|
| 668,595 | 2/1901 | Wanner | 165/155 |
| 1,265,552 | 5/1918 | Tripp | 165/45 |
| 3,330,333 | 7/1967 | Moss | 165/45 |
| 4,128,204 | 12/1978 | Wade | 165/45 X |
| 4,279,291 | 7/1981 | Lambert | 165/45 X |
| 4,921,039 | 5/1990 | Ghiraldi | 165/45 X |
| 5,339,890 | 8/1994 | Rawlings | 165/45 |
| 5,383,337 | 1/1995 | Baker | 165/45 X |

FOREIGN PATENT DOCUMENTS

| | | | |
|---|---|---|---|
| 0060128 | 4/1982 | Japan | 165/45 |
| 0208335 | 11/1984 | Japan | 165/45 |
| 2249623 | 5/1992 | United Kingdom | 165/45 |

*Primary Examiner*—Christopher Atkinson

[57] ABSTRACT

An apparatus for cooling and warming pole-mounted electronics includes a hollow pole having an upper portion capable of supporting the electronics and a lower portion supported by the ground. An air duct is disposed within the hollow pole such that the hollow pole and the air duct are substantially concentrically aligned about a central longitudinal axis, creating an annular air conduit between the air duct and the hollow pole. A circulating fan is fastened in the lower portion of the hollow pole above ground level. In cooling operation, warm air is drawn downward from the electronics through the air duct, cooled below ground level, and returned via the annular air conduit. The shape of the hollow pole is selected such that at a particular orientation of the sun, the ratio of the shaded surface to the illuminated surface is greater than one.

24 Claims, 3 Drawing Sheets

METHOD AND APPARATUS FOR COOLING AND WARMING POLE-MOUNTED ELECTRONICS

FIELD OF THE INVENTION

This invention relates generally to systems for regulating the temperature of electronics equipment, and more particularly to a method and apparatus for cooling and warming pole-mounted electronics.

BACKGROUND OF THE INVENTION

Until recently, base stations deployed in cellular telecommunications systems have consisted of two major components: a large hut and an adjacent tower. The huts have been filled with electronic equipment and a set of radio antennas have been mounted on the tower.

As traffic increases in cellular telecommunications systems, the coverage area for the available channels of a typical base station must decrease in order for the channels to be reused at other base stations. This fact in combination with the progress of miniaturizing electronics will enable future base stations to be configured differently.

Each base station will require significantly less bulky electronics, less power will be required to operate the radios, and the antennas will be mounted on short masts because the radio signals will need to cover less area. As a result, the equipment will be less obtrusive to the environment and installations will require much less real estate and cost less to manufacture. An arrangement in which a pole about twenty (20) feet high with the equipment installed in a small enclosure mounted thereon will replace the hut and tower.

The electronics used in the new type of base stations described above are enclosed in small housings (e.g., 2 feet by 2 feet by 2 feet) and will dissipate on the order of one hundred (100) watts. When the equipment is installed indoors, it is not difficult to cool electronics that dissipate that much power. However, two aspects of outdoor installations create significant difficulties. The first aspect is that such installations must be sealed from the environment to keep out rain and dust. The second aspect is that during the summer season the heat load from the sun adds a burden to the thermal management equipment which can be significantly greater than the load from the electronics. Typically, the way to cool equipment in this situation is to use a fan for circulating air which is mounted adjacent to the electronics within the enclosure.

This way of dissipating heat from the electronics in the enclosure complicates the design of the enclosure because of the need for heat management devices such as heat sinks. As the electronics become more complex, increased heat dissipation is often required, which further increases the size of the enclosure as well as the heat sinks. Thus, heat dissipation capability is a significant design parameter for the enclosure.

The electronics for the base station may be highly reliable, and may require few maintenance calls during the service life of the equipment. Fans, however, are rotating machinery which require regular maintenance or frequent replacement. Service calls for such cooling fans are difficult and expensive because of the specialized equipment (e.g., a "cherry picker" vehicle) required to access the fan mounted at the top of the pole.

SUMMARY OF THE INVENTION

It is an objective of the invention to create an apparatus for thermally managing a pole-mounted electronics assembly.

It is another objective of the invention to create an apparatus which efficiently cools and warms the pole-mounted electronics assembly.

It is a further objective of the invention to create such an apparatus which is easily maintained and repaired.

These and other objectives are achieved by a method and apparatus for cooling and warming pole-mounted electronics according to the invention. An illustrative embodiment of the apparatus for cooling and warming pole-mounted electronics includes a hollow pole having an upper portion and a lower portion, the upper portion capable of supporting an electronics and enclosure assembly and the lower portion extending below and supported by the ground. An air duct is disposed within the hollow pole such that the hollow pole and the air duct are concentrically aligned on a common central longitudinal axis. An air circulating fan is disposed slightly above ground level inside the air duct within the hollow pole. The air duct and the hollow pole define an annular air conduit between the air duct and the hollow pole.

The fan, the hollow pole, and the air duct cooperate so that in cooling operation warm air can be drawn by the fan downward from the electronics in the enclosure through the air duct underground to cool the warm air, and the cooled air can be drawn upward back to the electronics via the annular air conduit defined between the air duct and the hollow pole to cool the electronics. In heating operation heat is transferred from the ground to the circulating air to warm the electronics at the top of the hollow support pole.

The apparatus is an efficient cooling and heating system which can be conveniently maintained and repaired by way of an access hatch through the hollow pole. Separating the heat dissipation structure and process from the electronics enclosure reduces design constraints.

The apparatus can be constructed from readily commercially available materials. Deployment of the apparatus is compatible with existing pole installation technologies and an expensive "cherry picker" vehicle is not required to maintain the circulating fan.

Many types of hollow poles can be used, for example., a hollow steel pole. A polyvinyl chloride (PVC) pipe (for use as the air duct) with a circulating fan fastened therein can be combined with a steel pole and installed into a hollow concrete foundation. Or, a combination of inner and outer PVC pipes can be deployed in an already standing steel (or other type of) pole.

The cross-sectional shape of the hollow pole can be controlled to affect thermal performance and efficiency. According to an illustrative embodiment of the invention, the hollow pole of the apparatus presents a cross-sectional configuration other than circular such that, at a particular orientation of the sun, the ratio of the shaded outer surface area of the pole to the illuminated outer surface area of the pole is greater than one. An example of this is a triangular cross-sectional configuration having one face positioned toward the sun at a particular time and location while the other two faces are shaded and dissipate heat.

Other features and advantages of the invention will become apparent from the following detailed description, taken in conjunction with the accompanying drawing, which illustrate, by way of example, the features of the invention.

DETAILED DESCRIPTION OF THE PREFERRED EMBODIMENTS

This invention relates to cooling and warming pole-mounted electronics and addresses the problem of expensive and time consuming fan maintenance by locating the fan nearer the ground and providing appropriate ducting to deliver cooled or warmed air to the pole-mounted electronics. If the thermal loads are small, natural air currents induced within the pole are sufficient to cool the electronics without the use of a circulating fan.

Whereas in previous practice a fan for circulating air is deployed within the enclosure that houses the electronics, according to the principles of the invention a hollow pole supports an electronics assembly mounted in a housing at the top of the pole, and an air duct is provided within the hollow pole. Preferably, both the hollow pole and the air duct extend below ground level into a hollow concrete or steel base. In other embodiments the air duct does not necessarily extend below ground level or is not necessary. A fan for circulating air is installed within the lower end of the air duct, accessible for maintenance and repair. The air duct, the circulating fan, and the hollow pole cooperate to regulate the temperature of the pole-mounted electronics. The fan draws air from the electronics down to an area below ground, wherein air is subsequently moved back up to the electronics at the top of the hollow support pole through the annular air conduit created between the air duct and the hollow pole.

Figure 1:
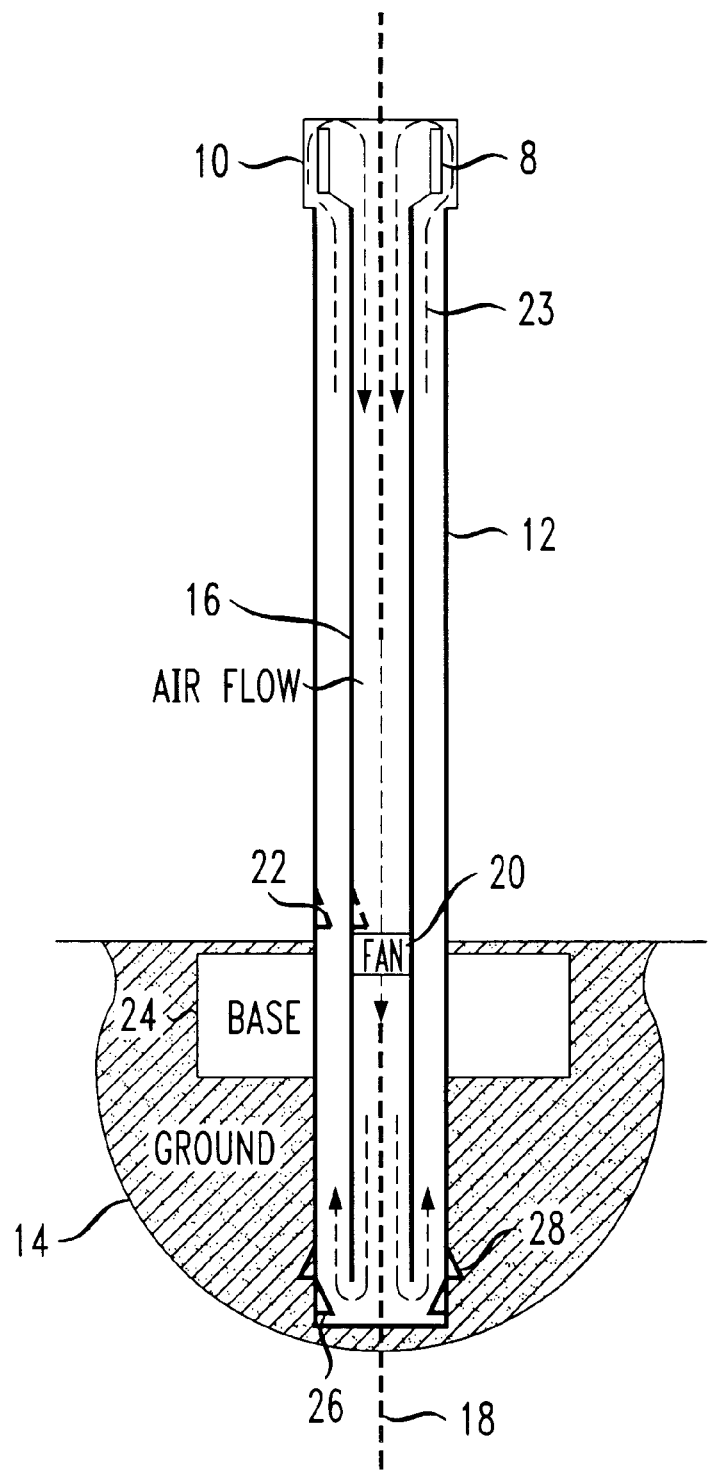
FIG. 1 is a sectional elevational view of an apparatus for cooling and warming a pole-mounted electronics assembly in accordance with the principles of the invention.

FIG. 1 shows an illustrative embodiment of an apparatus for cooling and warming pole-mounted electronics in accordance with the principles of the invention. Referring to FIG. 1, the base station electronics 8 are installed in an enclosure 10 that is mounted to the top of a twenty-foot hollow pole 12 having an upper portion and a lower portion. The upper portion supports the enclosure 10 housing the electronics 8 and the lower portion extends below and is supported by the ground 14. An air duct 16 through which air can move is disposed within the hollow pole 12. The air duct 16 and the hollow pole 12 are in concentric alignment on a common central longitudinal axis 18. A circulating fan 20 is installed within the lower end of the air duct 16. The fan 20 is located at or slightly above ground level (e.g., two feet above ground level) for easy inspection and maintenance by way of a maintenance hatch 22 through the hollow pole 12 and air duct 16.

During cooling operation, warm air 23 from the mounted electronics assembly is drawn downward by the circulating fan 20 through the air duct 16, discharged into the annular air conduit defined between the hollow pole 12 and the air duct 16 where it is cooled underground, and then the cooled air is drawn upwards through the annular conduit by operation of the circulating fan 20.

The hollow pole 12 and the air duct 16 are supported and held by a concrete base foundation 24. The concrete base foundation 24 is at least partially hollow to allow both the air duct 16 and the hollow pole 12 to extend below ground level.

The circulating fan 20 draws air from the electronics assembly downward and out the lower end of the air duct 16 where it discharges into the annular air conduit defined between the hollow pole 12 and the air duct 16 and returns upward to the electronics.

In the continental United States, soil temperatures below ground typically remain near 55° F. in summer and winter. During the summer the air discharged from the air duct 16 is cooled as a result of contact with the earth mass. Similarly, during winter months very cold air discharged from the air duct 16 could be warmed by operation of the apparatus taught herein.

Because summer air temperatures in the United States can reach 115° F., and because air within the electronics enclosure 10 can be heated another 20° F. to 30° F. by the sun and the working electronics, a significant temperature differential exists between the air discharged from the air duct 16 and the below-ground walls of the hollow pole 12. The depth of the below-ground lower portion of the hollow pole 12 is selected to provide sufficient surface area for adequate cooling of the incoming air. Relying upon cooling from the earth (in contact with the below-ground section of the hollow pole 12) means that the size of the circulating fan 20 can be significantly reduced, thereby lowering the cost of the fan.

The below-ground portion of the hollow pole 12 could include either or both internal fins 26 and external fins 28 to improve heat transfer from the below-ground section to the earth. The internal fins 26 extend inwardly from the lower portion of the pole 12. The external fins 28 extend outwardly from the lower portion of the pole 12. The external fins 28 may also provide extra stability by coupling the pole 12 to the ground 14 and/or the base 24 more securely.

The base 24 for the apparatus should include buoyancy resistance because the sealed, below-ground portion of the hollow pole 12 (including a portion of the air duct 16 and the annular conduit therein) would tend to float in the event that the ground 14 became flooded. In some cases, the below-ground section of the apparatus could be minimal if the fan-induced air speed were sufficient to cool the electronics entirely by dissipating heat from the shaded outer surface of the pole 12 to ambient air.

In a specific embodiment of the invention, a 4"-diameter fan rated at 100 cubic feet per minute draws air through a 22-foot and 4"-diameter air duct and discharges to a 24-foot and 5.4"-diameter hollow pole. The worst case solar loading (e.g., Yuma, Arizona in the summer) for this specific embodiment would be about 1300 watts. For 100 watts of electronics dissipation, a temperature rise over ambient temperature of about 23° F. would result with no below-ground cooling. Below-ground cooling (e.g., from five feet of air duct and six feet of hollow pole underground) reduces this rise by about 7° F.

One of the advantages provided by the invention is that the cooling and warming provided by the apparatus may allow electronic components specified for indoor use (e.g., 0° F.–150° F.) to be used outdoors, which ordinarily requires ruggedized components (e.g., specified for –40° F.–185° F.). Ruggedized components are usually significantly more expensive than corresponding standard components.

The hollow metal pole can be (in some cases partially) covered with a material that provides insulation from solar radiation. The insulation material isolates the air within the hollow pole from the effect of the sun heating the hollow pole, so that the air moving down the air duct discharging into the ground will be significantly cooler.

Some pole-mounted enclosures for cell site electronics may include antenna structures that are integral with the wall of the enclosure to minimize unsightly whip antennas and to provide improved directivity of the radio energy. If so, the effectiveness of the process by which the pole-mounted enclosure dissipates heat is significantly diminished. An apparatus in accordance with the principles of the invention offers a better means of thermal management for this type of antenna arrangement.

Figure 2:
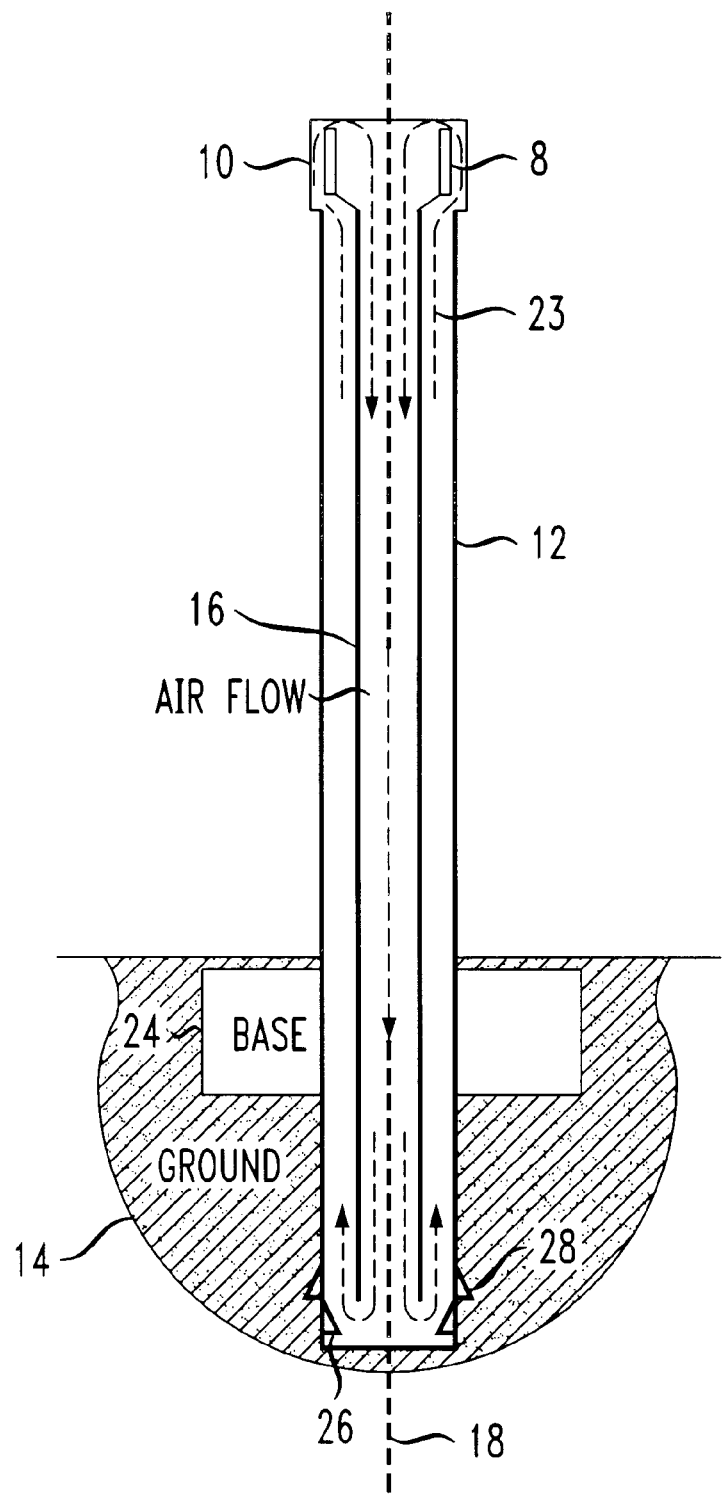
FIG. 2 is a sectional elevational view of an apparatus for cooling and warming a pole-mounted electronics assembly in accordance with the principles of the invention.

FIG. 2 shows a second embodiment of the apparatus for cooling and warming pole-mounted electronics in accordance with the principles of the invention. Rather than using the circulating fan 20 depicted in FIG. 1, the apparatus depicted in FIG. 2 uses the natural convection induced by the sun heating one side of the hollow pole 12 to circulate air in the apparatus. Solar heating warms the air in the annular conduit defined between the air duct 16 and the hollow pole 12, causing the warm air to rise. Such air motion draws cool air from the inner-disposed air duct 16, through the cooler below-ground area, into the annular conduit. This approach saves the cost of the circulating fan and the cost of fan maintenance, and is advantageous for relatively low electronics power dissipation levels that can be cooled by natural convection.

For modern base station applications, cell site electronics can be mounted at the top of poles from twenty to thirty feet high. The pole support structure, which provides cooling according to the principles of the invention, can be shaped to minimize the ratio of illuminated outer surface area to shaded outer surface area. As taught herein, controlling the cross-sectional shape of the pole support structure improves the cooling capability for the worst case solar orientation with respect to temperature rise.

Because a standard round pole may be limited in its ability to effectively provide cooling to the electronics which it supports, the invention also encompasses a pole shape which is structurally adequate to support the electronics and which has a cross-sectional area large enough for sufficient flow of cooling air. Such a shape limits solar loading while increasing the proportion of pole that is shaded.

For equipment deployed in the United States, it is understood that the worst case heat loading scenario is Yuma, Ariz. in the summer. Yuma is located near the 32nd parallel so that the sun is almost directly overhead during the summer solstice at noon. Further, a typical worst case diurnal temperature profile can reach about 115° F. between 3:00 PM and 4:00 PM. The worst case conditions that should be used for designing outdoor electronics enclosures are an ambient temperature of 115° F. with the sun oriented at 3:30 PM while the earth is tilted 23.5° with respect to the daily path of the sun. An additional worst case assumption is that ambient wind is at 5 MPH.

As long as the solar loading exceeds the amount of heat dissipated by the electronics, insulating the surface of the enclosure toward the sun reduces the internal temperature of the enclosure. For pole-mounted electronics that are cooled by air drawn through the pole, the pole exposes a considerable amount of its outer surface to the sun.

Figure 3:
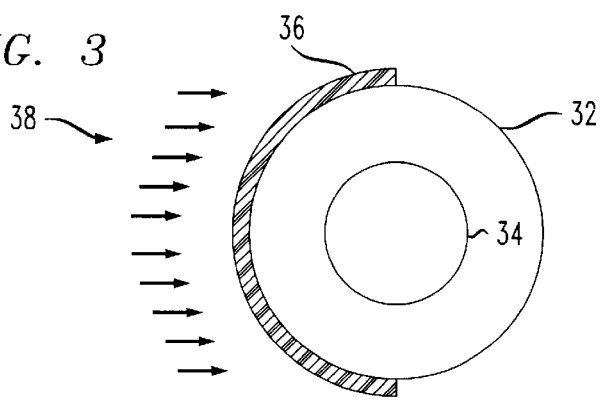
FIG. 3 is a sectional plan view of a hollow pole in accordance with the principles of the invention.

Using the pole for cooling the electronics requires two paths for circulating the air, one up and one down the pole. As previously discussed, a round pole having an internal, smaller round air duct disposed therein can be employed. Since half of the pole is exposed to the sun, half would be insulated. FIG. 3 shows a sectional plan view of the top of a hollow 18' round pole 32 having a diameter of 5.66", and a 17' round air duct 34 having a diameter of 4" within the pole 32 such that the pole 32 and the duct 34 are concentrically aligned on a common central longitudinal axis. Insulation material 36 is applied to a portion of the outer surface of the pole 32 confronting an exemplary solar load 38 of 1241 BTUs/hour. For the worst case conditions mentioned above when the insulated area is optimally oriented, the internal air temperature would be about 125.4° F. for an ambient temperature of 115° F. with the wind at 5 MPH.

Figure 4:
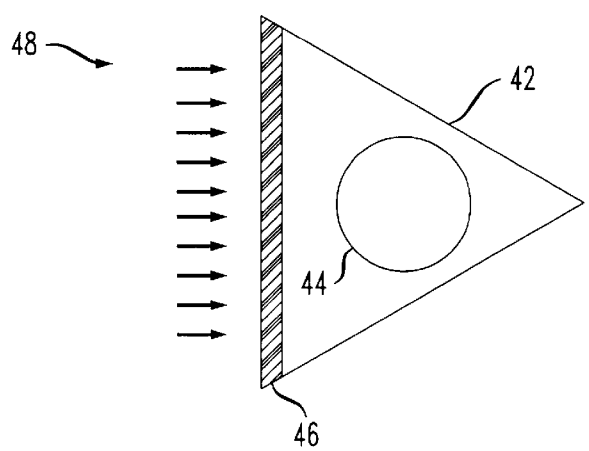
FIG. 4 is a sectional plan view of a hollow pole in accordance with the principles of the invention.

A variety of other cross-sectional pole configurations are more optimum for the worst case scenario. FIG. 4 shows a sectional plan view of the top of a hollow 18' pole 42 having an equilateral triangular cross-sectional configuration. Each side of the pole is 7.62" long. A 17' round air duct 44 having a diameter of 4" is disposed within the pole such that the pole and the duct are concentrically aligned around a common central longitudinal axis. Insulation material 46 is applied to a side of the outer surface of the pole 42, and is shown confronting an exemplary solar load 48 of 1602 BTUs/hour. The exemplary triangular shape shown in FIG. 4 causes, when one face is covered with insulation material and directed toward the sun, an internal air temperature of 122.5° F., for an ambient temperature of 115° F. and a wind at 5 MPH, which is a reduction in temperature rise of 35%. Note that in this configuration, one third of the pole surface is exposed to sunlight while two-thirds of the pole surface is in the shade. Further, note that even though this arrangement presents a larger surface to the sun in order to provide equal flow areas for the two air streams, it runs cooler.

Figure 5:
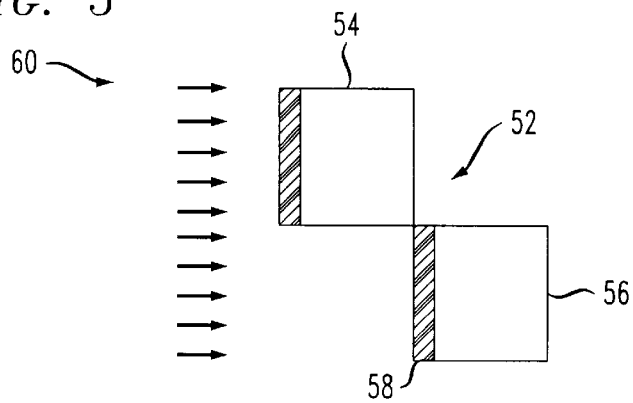
FIG. 5 is a sectional plan view of a hollow pole assembly in accordance with the principles of the invention.

FIG. 5 shows a sectional plan view of the top of a pole assembly 52 for use with an apparatus in accordance with the principles of the invention. The pole assembly 52 includes a first column 54 and a second column 56, on which the electronics and enclosure assembly is mounted. The circulating fan is installed in one of the two columns. Instead of disposing a separate air duct within a pole as in other embodiments of the invention, the two columns of the pole assembly 52 define a path and cooperate with the fan to circulate air between the electronics enclosure and the section of the columns that are below ground. The air is circulated upward in one column and downward in the other column of the pole assembly 52. Each column of the pole assembly 52 is 18' tall from the ground and has a square cross-sectional configuration. Each side of the square is 3.54", with a corner-to-corner distance of 5". A side of each square column is covered with an insulation material 58, preferably on the same side of each column. The insulation material 58 confronts an exemplary solar load 60 of 1489 BBTUs/hour. In the exemplary cross-sectional pole configuration depicted in FIG. 5, the internal temperature is 121° F., an improvement of 50% over the round cross-sectional pole configuration, for an ambient temperature of 115° F. with the wind at 5 MPH. In this configuration, one quarter of the pole surface is exposed to sunlight, while three quarters of the pole surface is in the shade. This minimizes the shadow cast in the worst case scenario.

Based on computer modeling, mathematical derivation, and empirical measurements it has been determined that the ratio of illuminated (and insulated) area to shaded area influences pole temperature. A triangular cross-sectional configuration having one insulated face positioned toward the sun with the other two faces dissipating heat works best in the worst case scenario of Yuma, Ariz. on Jul. 21 at 4:00 pm. More generally, however, any cross-sectional shape for the pole supporting active electronics cooled through the pole, in which, at a particular orientation of the sun, the ratio of the shaded outer surface area to the illuminated outer surface area is greater than one is encompassed by the principles of the invention.

From the foregoing it will be appreciated that the invention provides efficient cooling and warming of pole-mounted electronics and enables low-cost maintenance of the circulating fan.

While several particular forms of the invention have been illustrated and described, it will also be apparent that various modifications can be made without departing from the spirit and scope of the invention.

What is claimed is:

1. An apparatus for cooling and warming pole-mounted electronics, comprising:

a hollow pole presenting an outer surface, and having an upper portion and a lower portion, the upper portion capable of supporting electronics and the lower portion supported by the ground;

an electronics enclosure supported by the upper portion;

electronics contained inside the electronics enclosure;

an air duct disposed within the hollow pole;

a fan disposed within the lower portion of the hollow pole;

wherein the fan is separated from the electronics and located outside the electronics enclosure; and an annular air conduit defined by the hollow pole and the air duct;

wherein the fan is operative to circulate air through the annular air conduit;

wherein at a particular orientation of the sun the outer surface includes a shaded area that is shaded from the sun and an illuminated area that is illuminated by the sun, and wherein the shaded area is greater than the illuminated area.

2. An apparatus according to claim 1, wherein:

both the air duct and the hollow pole have a substantially circular cross-sectional configuration and are concentrically aligned on a common central longitudinal axis.

3. An apparatus according to claim 1, wherein:

the lower portion of the hollow pole is below ground level.

4. An apparatus according to claim 3, wherein:

the fan is operative to circulate air below ground and through the air conduit.

5. An apparatus according to claim 1, further comprising:

internal fins extending inwardly from the lower portion of the hollow pole.

6. An apparatus according to claim 1, further comprising:

external fins extending outwardly from the lower portion of the hollow pole.

7. An apparatus according to claim 1, further comprising:

insulation material at least partially covering the hollow pole.

8. An apparatus according to claim 1, wherein:

the fan is disposed above ground level.

9. A method for regulating the temperature of pole-mounted electronics, comprising the steps of:

providing a hollow pole presenting an outer surface, and having an upper portion and a lower portion, the upper portion capable of supporting electronics and the lower portion disposed below the surface of the ground;

supporting an electronics enclosure on the upper portion;

wherein electronics are contained inside the electronics enclosure;

disposing an air duct within the hollow pole thereby defining an annular air conduit;

circulating air, using a fan, through the air conduit;

separating the fan from the electronics;

locating the fan outside the electronics enclosure; and wherein at a particular orientation of the sun the outer surface includes a shaded area that is shaded from the sun and an illuminated area that is illuminated by the sun, and wherein the shaded area is greater than the illuminated area.

10. A method according to claim 9, further comprising the step of:

cooling the electronics by circulating air through the air conduit.

11. A method according to claim 9, further comprising the step of:

warming the electronics by circulating air through the air conduit.

12. A method according to claim 9, further comprising the step of:

circulating the air below ground level.

13. A method according to claim 9, further comprising the step of:

concentrically aligning the hollow pole and the air duct on a common central longitudinal axis.

14. An apparatus for cooling and warming pole-mounted electronics, comprising:

a hollow pole having an upper portion and a lower portion, the upper portion capable of supporting electronics and the lower portion supported by the ground;

an electronics enclosure supported by the upper portion;

electronics contained inside the electronics enclosure;

an air duct disposed within the hollow pole; and an annular air conduit defined by the hollow pole and the air duct;

wherein the hollow pole presenting an outer surface and having a central longitudinal axis, and having a triangular cross-sectional configuration in a plane normal to the central longitudinal axis, and wherein at a particular orientation of the sun the outer surface includes a shaded area that is shaded from the sun and an illuminated area that is illuminated by the sun, and wherein the shaded area is greater than the illuminated area.

15. An apparatus according to claim 14, wherein:

the hollow pole and the air duct are concentrically aligned on the central longitudinal axis.

16. An apparatus according to claim 14, wherein:

the lower portion of the hollow pole is below ground level.

17. An apparatus according to claim 14, further comprising:

internal fins extending inwardly from the lower portion of the hollow pole.

18. An apparatus according to claim 14, further comprising:

external fins extending outwardly from the lower portion of the hollow pole.

19. An apparatus acording to claim 14, further comprising:

insulation material at least partially covering the hollow pole.

20. An apparatus for cooling and warming pole-mounted electronics, comprising:

a hollow pole assembly including a first column and a second column defining a path through which air can move, the hollow pole assembly being capable of supporting electronics and being supported by the ground;

wherein sections of the first column and the second column, respectively, are below ground;

an electronics enclosure supported by the hollow pole assembly;

electronics contained inside the electronics enclosure;

a fan disposed within one of the first and the second columns;

wherein the fan is separated from the electronics and located outside the electronics enclosure:

the first column and the second column cooperate with the fan to circulate air between the electronics enclosure and the sections of the first column and the second column that are below ground;

the air is circulated upward in one column and downward in the other column; and each of the first and second columns having a central longitudinal axis, and having a substantially triangular cross-sectional configuration in a plane normal to the central longitudinal axis.

21. An apparatus according to claim 7, wherein:

the hollow pole having a central longitudinal axis, and having a substantially triangular cross-sectional configuration in a plane normal to the central longitudinal axis, and the outer surface having three faces, and one face of the hollow pole is covered with the insulation material.

22. A method according to claim 13, wherein:

both the hollow pole and the air duct have a substantially circular cross-sectional configuration.

23. A method according to claim 13, wherein:

the hollow pole having a substantially triangular cross-sectional configuration in a plane normal to the common central longitudinal axis.

24. An apparatus according to claim 19, wherein:

the outer surface having three faces, and a single face of the hollow pole is covered with the insulation material.

* * * * *